United States Patent
Zerbe et al.

(10) Patent No.: US 10,135,427 B2
(45) Date of Patent: *Nov. 20, 2018

(54) RECEIVER WITH TIME-VARYING THRESHOLD VOLTAGE

(71) Applicant: Rambus Inc., Sunnyvale, CA (US)

(72) Inventors: Jared L. Zerbe, Woodside, CA (US); Brian S. Leibowitz, San Francisco, CA (US); Qi Lin, Los Altos, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/829,693

(22) Filed: Dec. 1, 2017

(65) Prior Publication Data

US 2018/0159514 A1 Jun. 7, 2018

Related U.S. Application Data

(63) Continuation of application No. 13/393,314, filed as application No. PCT/US2010/056213 on Nov. 10, 2010, now Pat. No. 9,843,309.

(60) Provisional application No. 61/262,734, filed on Nov. 19, 2009.

(51) Int. Cl.

| H03K 5/08 | (2006.01) |
|---|---|
| H03K 3/013 | (2006.01) |
| G11C 7/02 | (2006.01) |
| H03K 5/153 | (2006.01) |
| H04L 25/49 | (2006.01) |
| H04L 25/06 | (2006.01) |
| H04L 25/03 | (2006.01) |

(52) U.S. Cl.
CPC ............... *H03K 3/013* (2013.01); *G11C 7/02* (2013.01); *H03K 5/153* (2013.01); *H04L 25/066* (2013.01); *H04L 25/4902* (2013.01); *H04L 25/4917* (2013.01); *H04L 25/03057* (2013.01)

(58) Field of Classification Search
CPC .......... G11C 7/02; H03K 3/013; H03K 5/153; H04L 25/03057; H04L 25/066; H04L 25/4917; H04L 25/0272; H04L 25/4902; H04L 1/00; H04L 25/03006; H04L 25/49; H04L 25/06; H04L 25/03
See application file for complete search history.

(56) References Cited

U.S. PATENT DOCUMENTS

| 4,509,180 A | 4/1985 | Neyer |
| 4,549,099 A | 10/1985 | Yamada et al. |
| 6,438,178 B1 | 8/2002 | Lysdal et al. |

(Continued)

OTHER PUBLICATIONS

PCT Search Report and the Written Opinion dated Jun. 28, 2011 re Int'l. Application No. PCT/US2010/056213. 8 Pages.

(Continued)

*Primary Examiner* — Rahel Guarino
(74) *Attorney, Agent, or Firm* — Lance Kreisman; Peninsula Patent Group

(57) ABSTRACT

A system for communicating information between circuits is described. A transmit circuit provides pulse-amplitude-modulation (PAM) signals via a communication channel to a receiver. A circuit in the receiver determines digital values from the received signals using a time-varying threshold voltage, which varies during the bit-time. This approach may compensate for inter-symbol interference (ISI) to increase the voltage and timing margins of the system.

20 Claims, 16 Drawing Sheets

(56) References Cited

U.S. PATENT DOCUMENTS

| | | |
|---|---|---|
| 7,834,482 B2 | 11/2010 | Fagg |
| 8,000,412 B1 | 8/2011 | Loinaz |
| 9,843,309 B2 * | 12/2017 | Zerbe .................... H03K 3/013 |
| 2004/0088406 A1 | 5/2004 | Corley et al. |
| 2004/0203559 A1 | 10/2004 | Stojanovic et al. |
| 2009/0161543 A1 | 6/2009 | Beadle |

OTHER PUBLICATIONS

Preliminary Report on Patentability (Chapter I of the PCT) dated May 31, 2012 in International Application No. PCT/US2010/056213. 6 pages.

* cited by examiner

RECEIVER WITH TIME-VARYING THRESHOLD VOLTAGE

CROSS-REFERENCE TO RELATED APPLICATIONS/TECHNICAL FIELD

Pursuant to 35 U.S.C. § 365, this application is a Continuation of U.S. Ser. No. 13/393,314, filed Feb. 29, 2012, entitled "RECEIVER WITH TIME-VARYING THRESHOLD VOLTAGE", which claims priority from International Application No. PCT/US2010/056213 published as WO 2011/062823 A3 on Aug. 18, 2011, which claims priority from U.S. Provisional Application No. 61/262,734, filed Nov. 19, 2009, entitled "RECEIVER WITH TIME-VARYING THRESHOLD VOLTAGE." International Application No. PCT/US2010/056213 and U.S. Provisional Application No. 61/262,734 are hereby incorporated by reference in their entirety. The present disclosure relates to techniques for communicating information between circuits. More specifically, the present disclosure relates to communication between a transmit circuit and a receive circuit using a receiver that has a time-varying threshold voltage.

BACKGROUND

Signals are communicated via communication channels, such as signal lines. Data bits may be transmitted via a communication channel by a driver using pulse amplitude modulation (PAM). A receiver typically recovers the transmitted data appropriately sampling and quantizing the received signals.

Transmission impairments, such as dispersion and attenuation in communication channels, often limit the edge rates of a received signal relative to the bit-time. In these band-limited systems, inter-symbol-interference (ISI) occurs when the residue power from previous bits interferes with the current bit being received. Interference can also arise from inductive or capacitive crosstalk caused by other signal lines. Such signal impairment reduces the voltage margin at the receiver and consequently increases the bit-error rate, as evidenced by a reduction of an opening in a so-called eye pattern, which is generated by synchronously overlapping edges in the received signals and which indicates the signal health. Such interference can worsen as the data-rate increases, especially in systems that use PAM with more than two levels (so-called multi-level PAM or multi-PAM).

BRIEF DESCRIPTION OF THE FIGURES

This disclosure is illustrated by way of example, and not by way of limitation, in the accompanying drawings. Like reference numerals refer to similar elements.

FIG. 2C-2 presents a flow chart illustrating the process of calibrating a time-varying threshold voltage.

DETAILED DESCRIPTION

Embodiments of the present disclosure improve the performance of a receive circuit by providing a time-varying threshold voltage to a receiver. This time-varying threshold voltage changes during a bit time and adapts better to the transition between different signal levels, thus providing more voltage margin to the receiver. This time-varying threshold voltage can vary discretely or continuously, and can effectively produce a larger eye opening, which can facilitate faster edge rates. As a result, the bit-error rate in the system is reduced.

Figure 1A:
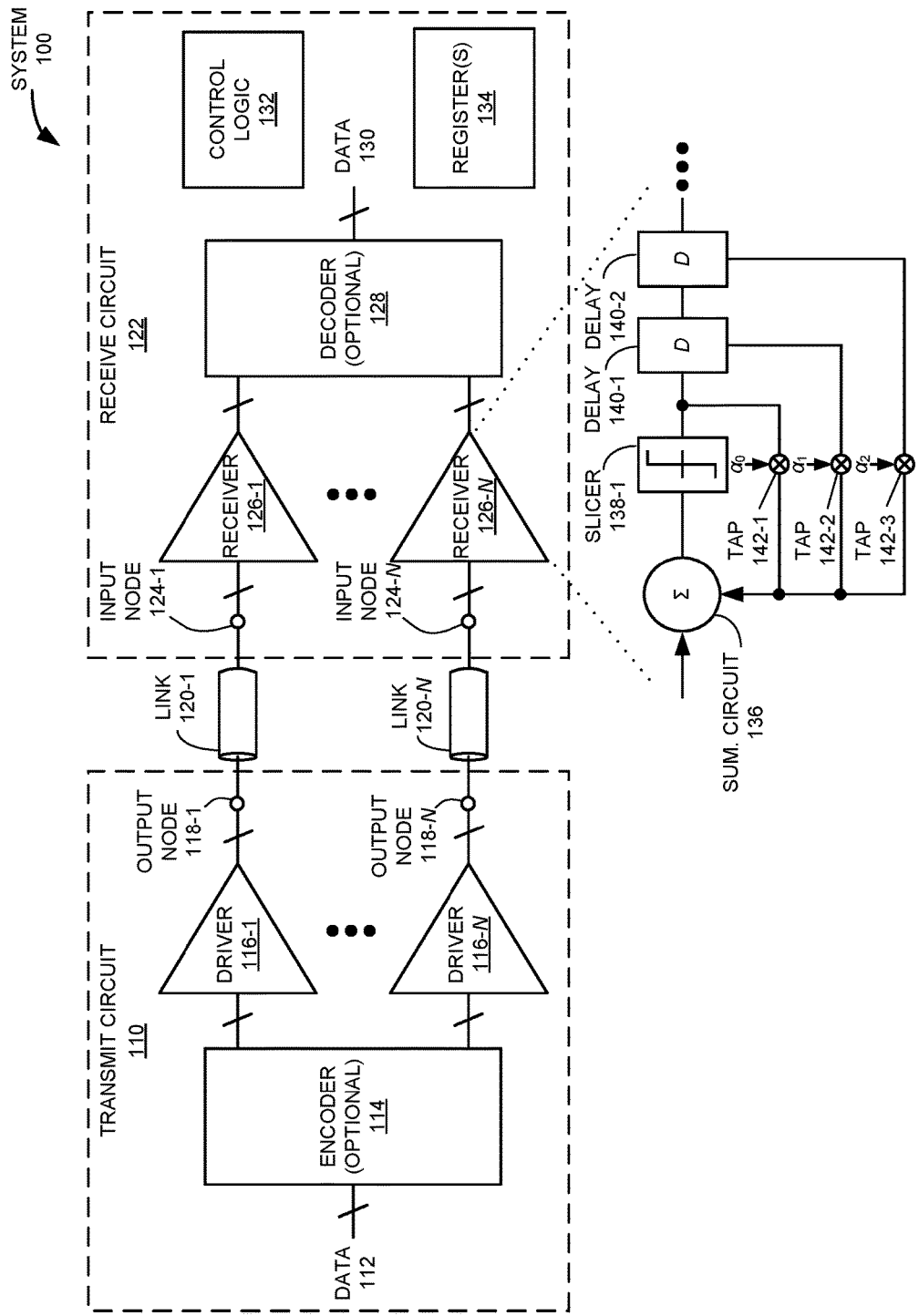
FIG. 1A illustrates a system including a transmit circuit in communication with a receive circuit.

FIG. 1A presents a system 100, which includes a transmit circuit 110 in communication with a receive circuit 122. In this disclosure, a "transmit circuit" or a "receive circuit" refers to an integrated circuit (e.g., an IC chip) that transmits or receives a signal. A "transmitter" or a "receiver" refers to a circuit block, often within an IC chip and part of a "transmit circuit" or "receive circuit", that transmits or receives a signal over a link. Furthermore, transmit circuit 110 and receive circuit 122 in FIG. 1A may be implemented on a single IC chip or different IC chips. As shown in FIG. 1A, one or more transmitters or drivers 116 (denoted as 116-1 to 116-N) produce signals, which correspond to data 112, on one or more links 120 (denoted as 120-1 to 120-N) via output pins or nodes 118 (denoted as 118-1 to 118-N). Data 112 includes a data sequence (such as a temporal pattern of "0" and "1" bits) characterized by the period of a bit, which is also referred to as "bit time" or "bit duration." Furthermore, drivers 116-1 to 116-N may use 2- or multi-PAM to encode the data. For example, the signals may be non-return-to-zero (NRZ) or 2-PAM signals, in which "1"s and "0"s in data 112 are represented by high and low voltages. Links 120-1 to 120-N convey the signals to input nodes 124 (denoted as 124-1 to 124-N) and one or more receivers 126 (denoted as 126-1 to 126-N) in receive circuit 122. A respective receiver may include circuits to determine digital values in data 130 from the received signal. In the absence of errors, data 130 is the same as data 112 after accounting for the time of transmission and reception.

Because of ISI during communication of the signals on links 120-1 to 120-N, a respective receiver, such as receiver 126-1, may include various circuits to mitigate the effect of interference. For example, a feed-forward equalizer may be used to compensate for pre-cursor ISI (interference caused by bits after a current bit) and a feedback equalizer may be used to compensate for post-cursor ISI (interference caused by bits preceding a current bit). In addition, there may be ISI due to cross-talk signals from other signal lines. The side bar in FIG. 1A illustrates an exemplary decision feedback equalization (DFE) circuit, in which a summation circuit 136, slicer 138-1 (which samples and quantizes the signal), digital delays (D) 140-1 and 140-2, and taps 142-1, 142-2, and 142-3 with coefficients $\alpha_i$ implement a finite-impulse-response (FIR) filter that subtracts the residue power of the previous bits from a current bit to mitigate the effects of ISI. Control logic 132 and registers 134 are also used by the receive circuit 122 to perform calibration and interpret commands sent by the transmit circuit 110.

Figure 1B:
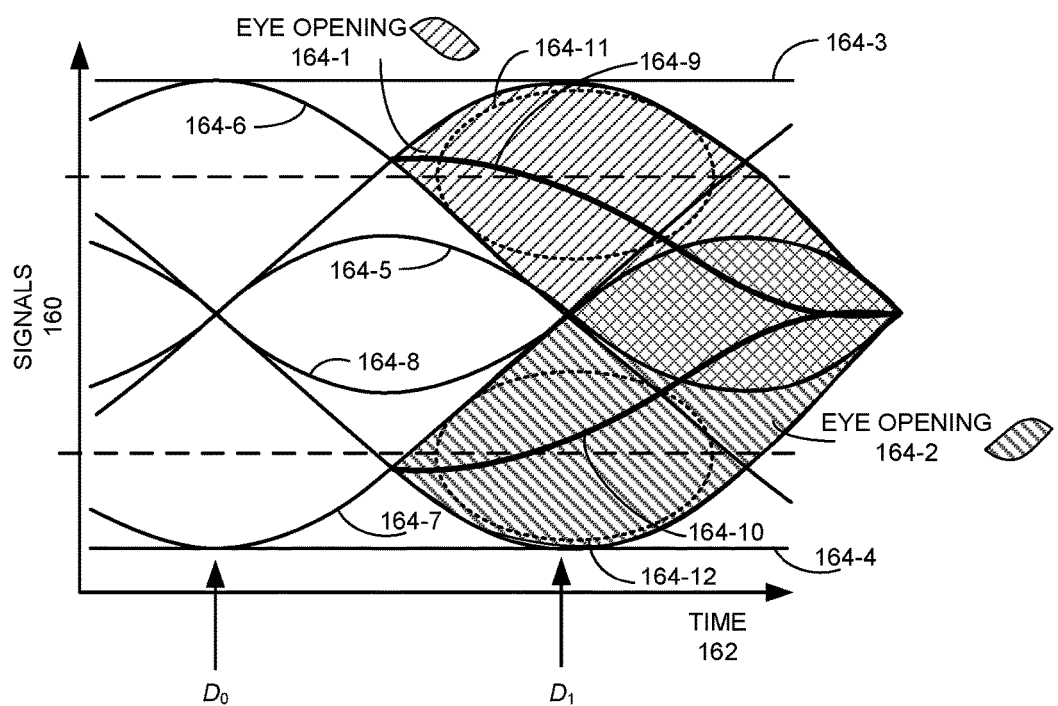
FIG. 1B illustrates an exemplary eye pattern for two-level pulse-amplitude-modulation (2-PAM) signals received by the receive circuit in the system of FIG. 1A.

While DFE can reduce the impact of ISI on system 100, if the coefficients $\alpha_i$ are fixed during a time interval (such as the bit-time), the improvements in the voltage and timing margins in the resulting eye pattern may be limited. This is shown in FIG. 1B, which presents an exemplary eye pattern of 2-PAM signals 160 detected by a DFE circuit, as a function of time 162 for DFE. In this graph, data sampling times $D_0$ and $D_1$ are separated by one bit duration. Lines 164-3 and 164-4 denote the static voltage levels for logical '1' and logical '0,' respectively. Lines 164-5 and 164-6 indicate signals transitioning from "1" at $D_0$ to "0" at $D_1$. The discrepancy between lines 164-5 and 164-6 is due to ISI from the previous bits. In the case of line 164-6, the bit before $D_0$ was a "1," which caused the signal level at $D_0$ to be substantially at the theoretical level of "1," i.e., substantially close to line 164-3. In the case of line 164-5, the bit before $D_0$ was a "0," which caused the signal level at $D_0$ to be between the theoretical signal levels of "0" and "1." Similarly, lines 164-7 and 164-8 indicate signals transitioning from "0" at $D_0$ to "1" at $D_1$. The discrepancy between lines 164-7 and 164-8 is due to ISI. In the case of line 164-8, the bit before $D_0$ was a "1," which caused the signal level at $D_0$ to be between the theoretical signal levels of "0" and "1." In the case of line 164-7, the bit before $D_0$ was a "0," which caused the signal level at $D_0$ to be substantially at the theoretical level of "0." Because the signal level of a logical "1" or "0" at $D_1$ depends on the values of multiple preceding bits, if the previous bits are taken into account, as with a DFE, there are two sloped eye openings, denoted by two shaded areas 164-1 and 164-2 marked by slant-hatch patterns in different directions instead of the single cross-hatched smaller area. To detect the proper logical values in a DFE, two time-varying threshold voltages, 164-9 and 164-10, are used. When implementing a DFE, the receiver system can determine which threshold voltage to use based on values of the preceding bit. If, for comparison, the threshold voltages were non-time-varying (represented as dashed lines), only a portion of the eye opening can be used. For example, for eye opening 164-1, only the portion corresponding to oval 164-11 can be used for signal detection (areas beyond the long axis of oval 164-11 have insufficient voltage margin above and/or below threshold voltage 164-9, and therefore cannot be used for reliable detection). Similarly, the portion of eye opening 164-2 that can be used for reliable signal detection is limited to the area corresponding to oval 164-12.

In general, it is desirable to obtain the usable portion of an eye opening as large as possible. The taller this usable portion is, the more voltage margin there is for the receiver's slicer, and hence the more tolerance the receiver has against voltage fluctuations. The wider this usable portion is, the more timing margin there is for the receiver's slicer, and hence the more tolerance the receiver has against timing jitter. Therefore, the shape of the usable portion of an eye pattern indicates the health of the received signal. When the "eye" closes, the receiver might experience an increased bit-error rate given the greater difficulty in differentiating logic levels.

In some embodiments, data is encoded as symbols by an optional encoder 114 as illustrated in FIG. 1A prior to transmission, and the received symbols are decoded by optional decoder 128. The aforementioned approaches can be used in these embodiments as well, where the threshold voltage is varied during a unit symbol interval.

As illustrated in FIG. 1B, the slicer in a receiver can use time-varying threshold voltages (which are sometimes referred to as "offset voltages") during a bit-duration to detect incoming 2- or multi-PAM signals. By using time-varying threshold voltages, the slicer can effectively increase both the voltage and timing margin of the usable portion of a sloping eye opening (e.g., eye openings 164-1 and 164-2). In particular, by using a time-varying threshold voltage that changes its value during a bit duration, the slicer can effectively rotate and increase the size of the usable portion of the eye opening (i.e., to provide a larger voltage and timing margin), and thus mitigate the effect of ISI (as illustrated below with reference to FIGS. 3A-3C). Although the exemplary threshold voltages illustrated 164-9 and 164-10 in FIG. 1B are continuously time-varying, embodiments of the present invention can employ various types of time-varying threshold voltages. For example, the threshold voltage can be configured to change its value at a certain time within a bit duration. In further embodiments, the time variation of the threshold voltage can be either discrete, with one or more changes, or be continuous based on a time-varying function.

Figure 1C:
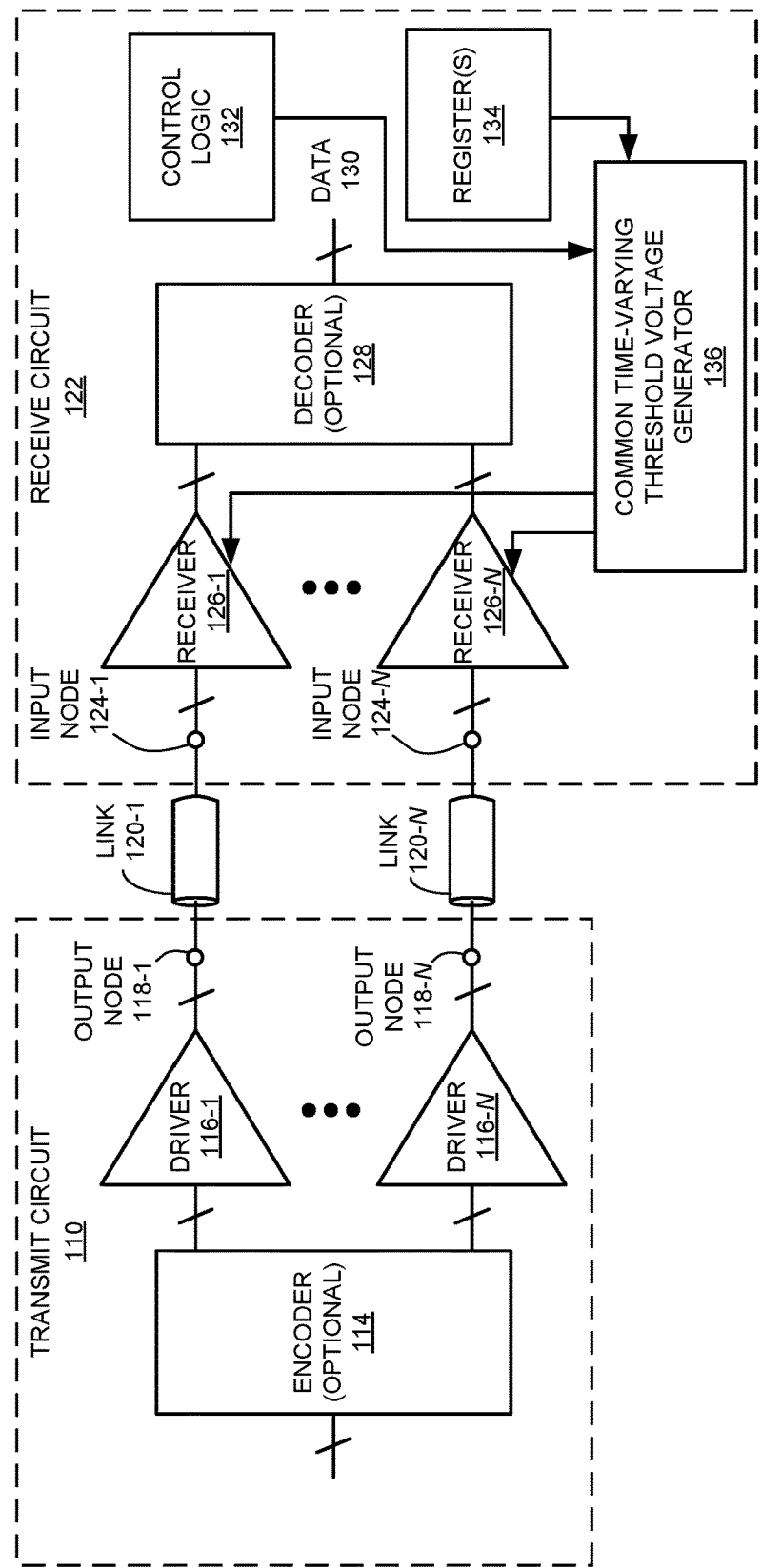
FIG. 1C illustrates a system with multiple transmission links where a time-varying threshold voltage is shared by multiple receivers.

FIG. 1C illustrates a system where a time-varying threshold voltage is shared by multiple receivers of one receive circuit 122. In FIG. 1C, elements in common with the embodiment of FIG. 1A are designated using like numbering. In FIG. 1C, however, a common threshold voltage generator 136 is also depicted, controlled by the control logic 132 of the receive circuit, and its associated registers 134. The common threshold voltage generator 136 can generate one or more time-varying voltage threshold signals, for example, positive and negative continuous-time signals $+/-\alpha(t)$, as will be described further below. It should be appreciated that by using a common threshold voltage generator for plural signal links in parallel (links 120-1 through 120-N), the implementation of FIG. 1C provides economical use of circuitry relative to an implementation where a threshold generator is provided for each signal link. By providing positive and negative signals as referenced above, common threshold voltage generator 136 permits each receiver 126-1 through 126-N to individually use partial response decision feedback equalization, or prDFE, using alternate, shared thresholds. The system of FIG. 1C may employ other forms of time-varying thresholds, e.g., signals which are varied among discrete levels, instead of signals which vary smoothly in time such as $+/-\alpha(t)$. As used herein, a time-varying threshold should be understood to mean one that changes voltage value as a function of time (including variation between multiple voltage levels, e.g., continuous or discrete transitions), whereas a continuous time-varying threshold should be understood to mean one with no voltage discontinuities during a bit-time. Although in conventional mathematical expressions "f(x)" often refers to a continuous function of x and f[x] often refers to a discrete function of x, in this disclosure "$\alpha(t)$" is used to denote both continuous and discrete functions of time t.

Figure 2A:
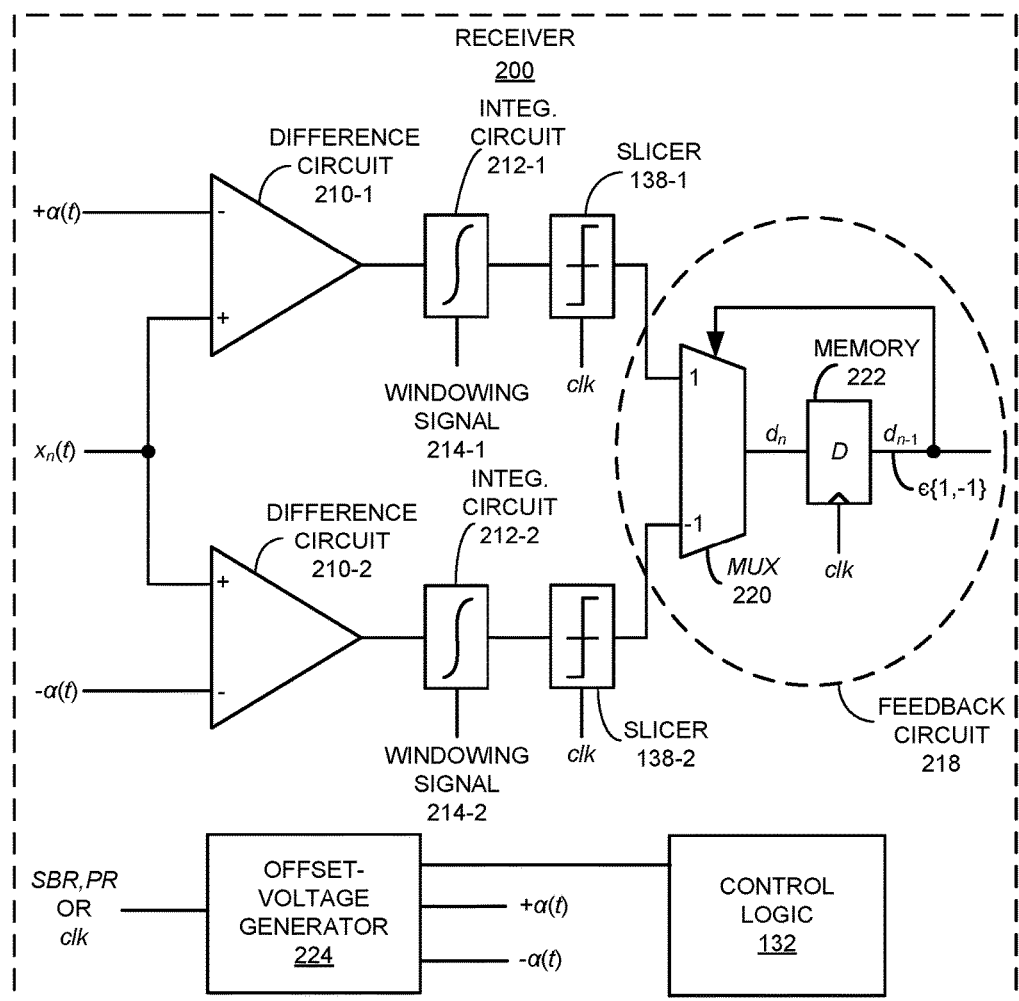
FIG. 2A illustrates an exemplary receiver.

FIG. 2A illustrates an exemplary circuit in a receiver 200. As shown in FIG. 2A, timing issues in DFE can be addressed by unrolling a portion of the feedback loop and adding parallelism (i.e., prDFE). Instead of subtracting a known value indicative of the residue power of the immediately preceding bit, each possible value for the residue power is subtracted concurrently (effectively taking two conditional samples before the actual value of the prior bit is resolved). In particular, two slicers 138-1 and 138-2, which are clocked by clock signal clk and determine digital values of the incoming signal, are offset by positive and negative time-varying threshold voltages $\alpha(t)$ for the residual ISI via difference circuits 210-1 and 210-2, respectively. Difference circuits 210-1 and 210-2 compare the signal $x_n(t)$ with the time-varying threshold voltages $\alpha(t)$ and $-\alpha(t)$, respectively. Time-varying threshold voltage $\alpha(t)$ varies during the bit-time, which changes the way clocked receiver 126-1 samples signal $x_n(t)$. Note that the function $\alpha(t)$ can be a continuous or discrete time-varying function, as mentioned above. In one embodiment, $\alpha(t)$ can change only once during a bit duration, that is, $\alpha(t)$ contains two discrete voltage levels. In some embodiments, a receiver can switch between multiple circuits which provide different, static thresholds.

The outputs of different circuits 210-1 and 210-2 indicate the difference between the input signal and the two threshold voltages $\alpha(t)$ and $-\alpha(t)$. The selection of one of the two threshold voltages is determined based on the preceding bits. Since the threshold voltage is time-varying, in order to improve the noise margin, the outputs from difference circuits 210-1 and 210-2 may be integrated by integrator circuits 212-1 and 212-2, respectively (as opposed to sampling at one point during the bit-time). Thus, receiver 200 may be an integrating slicer. Integrator circuits 212-1 and 212-2 may be respectively gated by windowing signals 214-1 and 214-2 during the bit-time. For example, in embodiments where a memory controller is in communication with a memory integrated circuit, a precharge-release signal may be used to initiate integration in integrator circuits 212-1 and 212-2, and a sense-activation signal may be used to clock slicers 138-1 and 138-2 to effectively end the integration.

Receiver 200 may include a feedback circuit 218, with a memory 222 (such as flip-flop) to store a digital value from an immediately preceding bit-time (i.e., the previous decision), and a multiplexer (MUX) 220. Multiplexer 220 may selectively couple an output from one of slicers 138-1 and 138-2 to an output of receiver 200 during a current bit-time based at least on the stored digital value in memory 222. Thus, if the immediately preceding bit is a "1," multiplexer (MUX) 220 selects the output from slicer 138-1, and if the immediately preceding bit is a "0," multiplexer (MUX) 220 selects the output from slicer 138-2.

The time-varying threshold voltage $\alpha(t)$ may be selected based at least on eye-pattern characteristics in order to obtain increased voltage and timing margins. For example, the time-varying threshold voltages $\alpha(t)$ may correspond to a voltage-change rate associated with an isolated transition(s) in received signal $x_n(t)$. In particular, an offset-voltage generator circuit 224 may generate the time-varying threshold voltage $\alpha(t)$ based at least on a single-bit response (SBR) (for example, 1-SBR(t)) and, more generally, on the received pulse response (or impulse response) of the communication channel. In this way, the time-varying threshold voltage $\alpha(t)$ may reflect the channel characteristics, such as the transfer function. The time-varying threshold voltage $\alpha(t)$ may have a characteristic which is set once and does not need to be constantly adapted or updated for environmental variations. Because the SBR incorporates the edge rate of the received signal $x_n(t)$, it can be used to track the centers of the eyes for 2-PAM signals.

In some embodiments offset-voltage generator circuit 224 generates the time-varying threshold voltages $\alpha(t)$ based at least on the clock signal (clk). For example, one of the communication channel links 120 may convey a source-synchronous clock signal, and the time-varying threshold voltages $\alpha(t)$ may correspond to the clock signal. This clock signal may reflect at least a portion of the channel characteristics, such as a portion of the transfer function (for example, the clock signal may have an edge or transition rate that is related to the slopes of eyes in FIG. 1C). A buffered version of such a source-synchronous clock signal may be used. In further embodiments, a clock signal can be generated in receive circuit (i.e., the clock signal does not need to be source-synchronous).

The time-varying threshold voltage may be deterministic or may be adapted over time. For example, the adaptation may be based at least on: a detected error in the digital values (such as bit-error rate), a mean square error between the digital values and an equalization target pattern, and/or another performance metric. The adaptation may use techniques such as least-mean square optimization using one or more of these performance metrics. Furthermore, the adaptation may occur during a normal operating mode and/or a calibration mode (see description in conjunction with FIG. 2C-2, further below). Thus, the adaptation may be performed once, continuously, and/or as needed.

In some embodiments, the use of time-varying threshold voltages (as opposed to fixed threshold voltages) can be selectively enabled or disabled by storing an activation bit in one of one or more the programmable register(s) used in concert with the control logic. The control logic may selectively enable or disable the time-varying threshold voltages based at least on the stored activation bit.

When the use of time-varying threshold voltages is enabled, one or more characteristics of the time-varying threshold voltages, such as the magnitude and change rate, may be specified by threshold-voltage configuration information stored in programmable register(s) 134. In response to this configuration information, control logic 132 may provide signals or instructions to offset-voltage generator 224 to accordingly generate the time-varying threshold voltages.

Figure 2B:
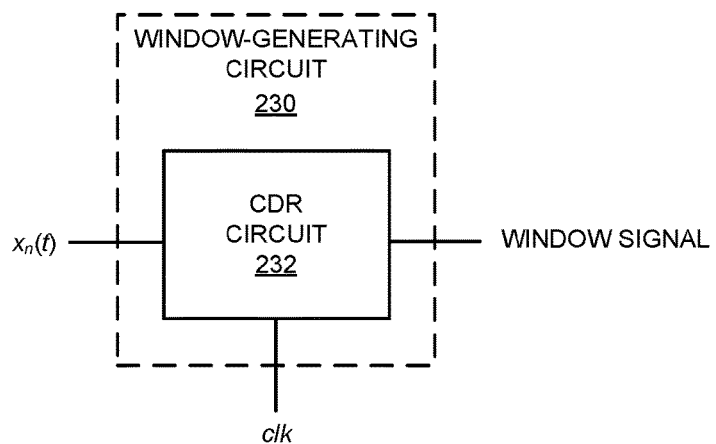
FIG. 2B illustrates an exemplary window-generating circuit in the receive circuit in the system of FIG. 1A.
Figures 1, 2C:
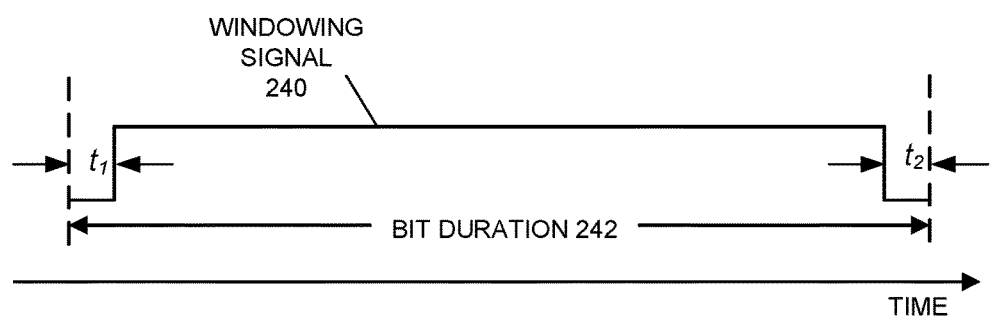
FIG. 2C-1 illustrates an exemplary windowing signal.

FIG. 2B presents a window-generating circuit 230 that includes one or more phased-locked loops (PLLs) or delay-locked loops (DLL), which reside in clock and data recovery (CDR) circuit 232. CDR circuit 232 can use a local clock signal clk to generate a number of phase vectors, and can select a phase vector that produces a windowing signal that best matches the detected incoming signal and the corresponding data eye. For example, such a windowing signal 240 during bit duration 242 is shown in FIG. 2C-1. Windowing signal 240 might not overlap with the entire bit duration, because only during part of the entire bit duration is the eye actually open. For example, the beginning of windowing signal 240 can be offset from the begging of a bit-time by $t_1$. The end of windowing signal 240 can be offset from the end of the bit-time by $t_2$. Calibration of CDR circuit 232 (FIG. 2B) may occur during a calibration mode, such as an incoming signal corresponding to a predefined constant frequency pattern, or by using a constant-frequency pattern in a preamble to a group of bits (e.g., in a data packet).

Because the time-varying thresholds track the center of the respective eyes across an extended time, receiver 200 can utilize relatively wide windowing signals 240 for integrator circuits 212-1 and 212-2 as shown in FIG. 2C-1, even though the eyes may not have substantially horizontal alignment. If the threshold voltages are constant, windowing signal 240 would be shorter relative to the bit duration, because the usable portion of a data eye is smaller.

Figures 2, 2C:
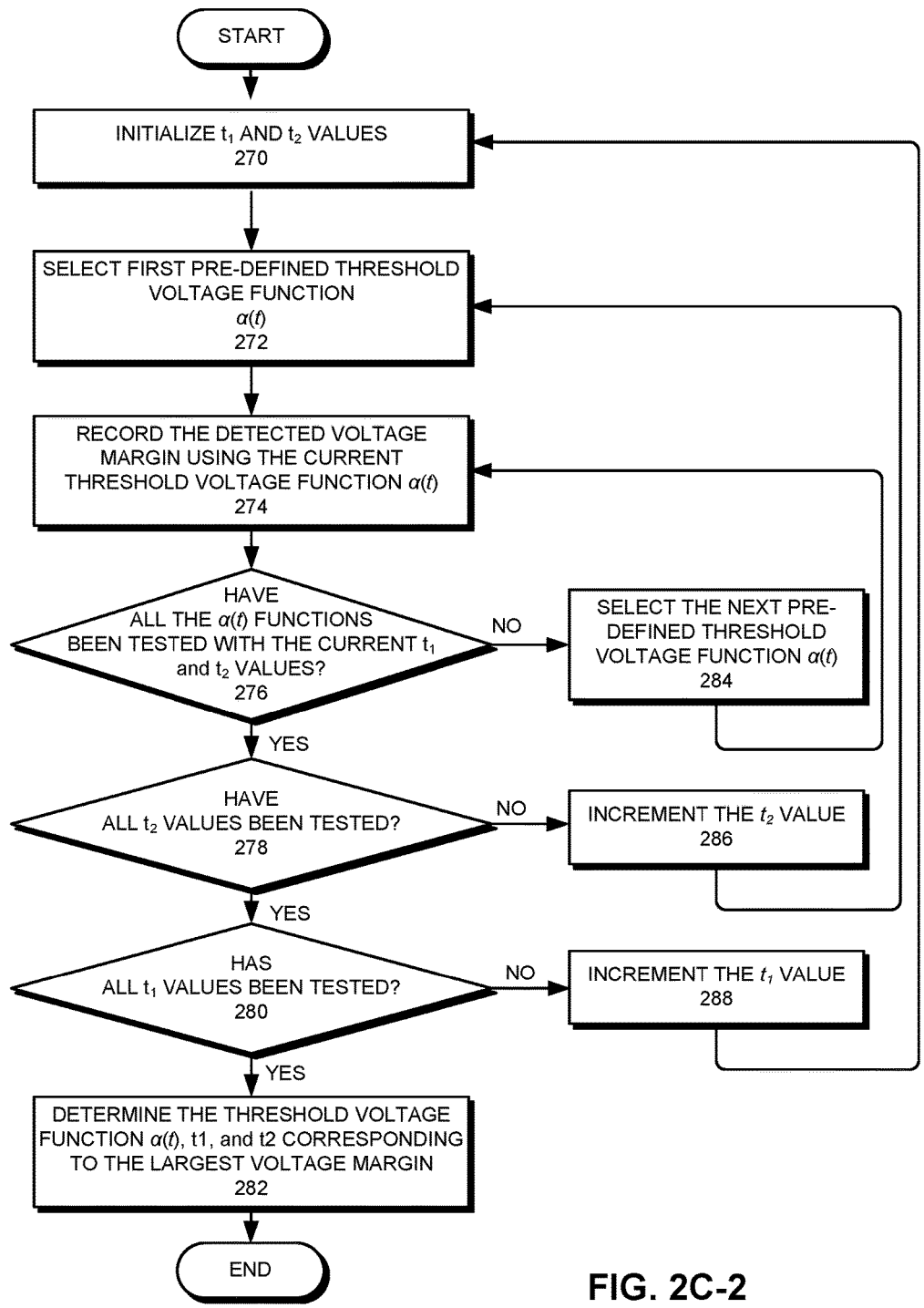

FIG. 2C-2 presents a flow chart illustrating the process of calibrating a threshold voltage. In general, the receiver can scan through a number of possible windowing-signal widths and positions, and different forms of threshold voltages (i.e., different $\alpha(t)$ functions). The different $\alpha(t)$ functions can be different type of functions, such as sine, cosine, or polynomial functions, as well as one type of function with difference sets of parameters (for example, a linear function with different sets of slope and y-intercept values).

In the example illustrated in FIG. 2C-2, the receiver first initializes the values of $t_1$ and $t_2$ (see FIG. 2C-1) (operation 270). For example, both $t_1$ and $t_2$ can be initialized to zero. The receiver then selects the first threshold voltage function $\alpha(t)$ (operation 272). Subsequently, the receiver receives the signal and records the detected voltage margin (for example, an integrated voltage) using the current threshold voltage function $\alpha(t)$ (operation 274). The receiver then determines whether all the $\alpha(t)$ functions have been tested with the current $t_1$ and $t_2$ values (operation 276). If not, the receiver selects the next threshold voltage function and repeats the recordation (operations 284 and 274). If all the $\alpha(t)$ functions have been tested, the receiver further determines whether all the $t_2$ values have been tested (operation 278). If not the $t_2$ value is incremented and the recordation process is repeated (operations 286 and 272). Otherwise, the receiver determines whether all $t_1$ values have been tested (operation 280). If not, the $t_1$ value is incremented and the recordation process is repeated (operations 288 and 272). After all the $t_1$, $t_2$ values and all the $\alpha(t)$ functions have been tested, the receiver determines the threshold voltage function $\alpha(t)$, and $t_1$, $t_2$ values corresponding to the largest voltage margin in the detected signal (operation 282). The aforementioned calibration process can be performed once (e.g., at system start up), or multiple times dynamically to address changes such as signal drift caused by the environment. In one embodiment, this calibration can be optional, and the $t_1$, $t_2$ values and the $\alpha(t)$ function can be pre-programmed.

Figure 2D:
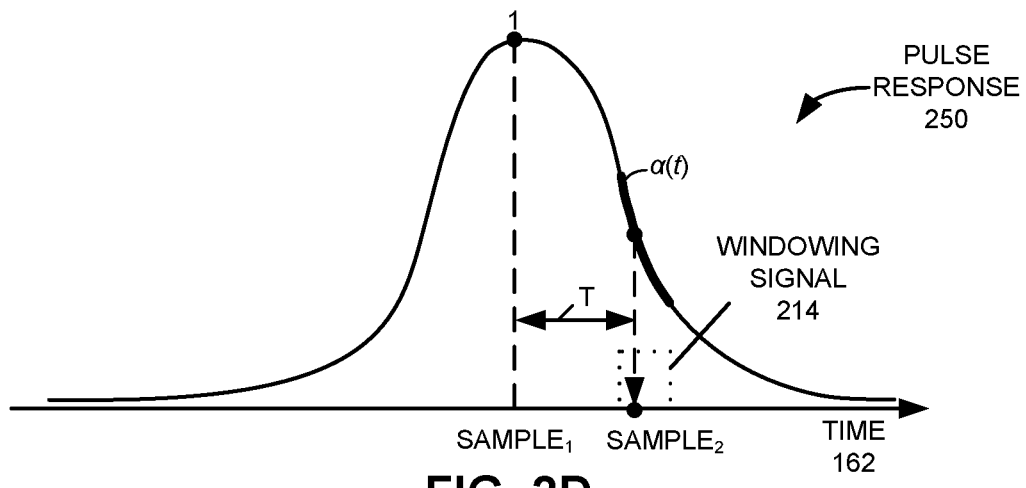
FIG. 2D illustrates an exemplary pulse response detected by the receive circuit in the system of FIG. 1A.

Another perspective is provided in FIG. 2D, which presents a pulse response (PR) 250. Pulse response 250 includes post-cursor ISI at $sample_2$ that is a residue of the bit transmitted at $sample_1$. Ideally, $sample_2$ would be zero (i.e., there would be no ISI). This can be achieved in receiver 200 by using time-varying offset voltages $\alpha(t)$ defined by pulse response 250. For example, the magnitude of the time-varying offset voltage $\alpha(t)$ is shown in bold in FIG. 2D during the time interval around $sample_2$. This time interval is specified by the windowing signals 214 during the clock period when the data bit at $sample_2$ is being received, and which can be used to gate integrator circuits.

In further embodiments, the time-varying threshold voltage $\alpha(t)$ can reflect an approximation to the SBR, such as: a linear ramp as a function of time, a sinusoidal function, or another time-varying function. Furthermore, the threshold voltage can vary discretely with respect to time. As a consequence, the time-varying threshold voltages $\alpha(t)$ may have a zero or a non-zero second time derivative. Furthermore, the system can use any mechanism that can facilitate comparison with multiple thresholds or voltage levels within a single bit time. The results of such comparison at different points in time during the bit time can be used to determine the logical value of the received signal.

Figure 2E:
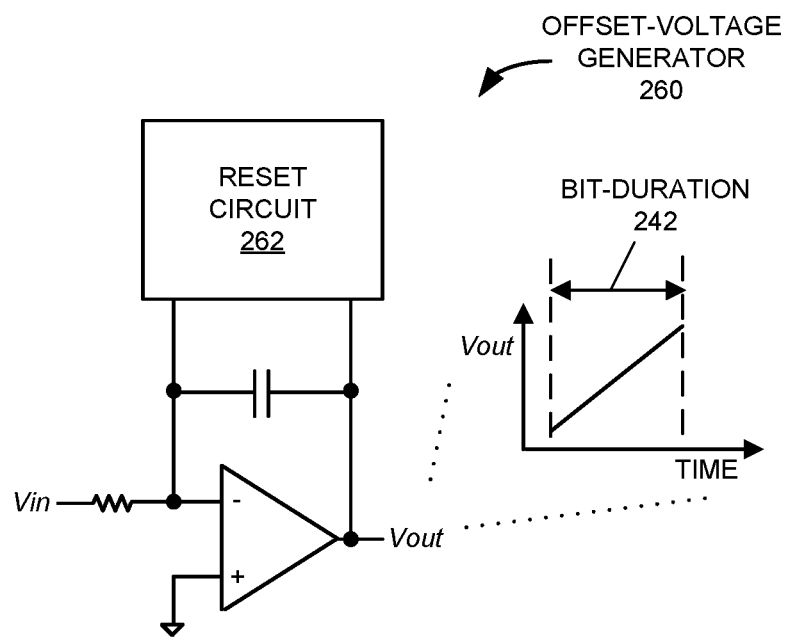
FIG. 2E illustrates an exemplary offset-voltage generator in the receiver of FIG. 2A.

FIG. 2E presents an offset-voltage generator 260 that generates a ramp. Based on signals from control logic 132, reset circuit 262 (such as a switch) may be closed to discharge the capacitor in the feedback path, thereby resetting the threshold voltage. The time-varying threshold voltage output by offset-voltage generator 260 may be continuous in both in time and voltage, as indicated in the upper right hand corner of FIG. 2E, or discontinuous in voltage, as indicated in FIG. 2F.

Figure 2F:
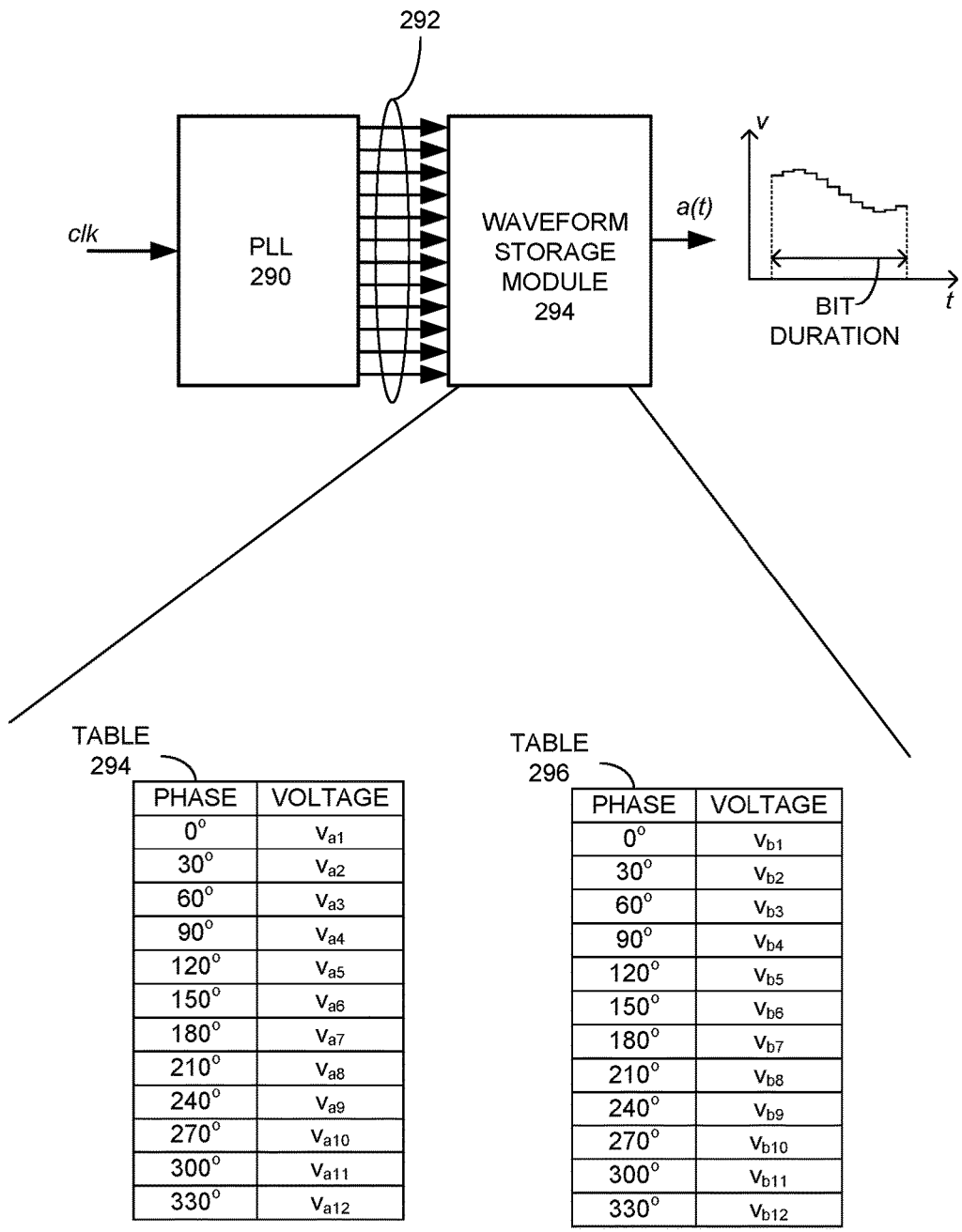
FIG. 2F illustrates an exemplary module for generating time-varying threshold voltages.

FIG. 2F presents an exemplary block diagram of a waveform-generation module. In this example, a clock signal clk (e.g., a local reference clock or the clock signal recovered by the CDR circuit) is used by a phase lock-loop (PLL) module 290, which produces a phase vector 292. Phase vector 292 includes 12 individual clock signals, each of which being offset by a pre-determined phase shift from the input reference clock signal. These 12 component clock signals are separate by 30°. Other numbers of components in the phase vector output, such as 16, 18, 24, are also possible.

The phase vector clock signals 292 are then used as input to a waveform storage module 294, which stores one or more $\alpha(t)$ waveforms. In one embodiment, waveform storage module 294 stores one or more waveforms in register banks. Each clock signal in phase vector 292 is used to trigger the reading of a respective register, which outputs the corresponding voltage level based on $\alpha(t)$. Waveform storage module 294 can store a number of waveform tables, such as tables 294 and 296. During calibration, the receiver can use a number of waveforms and select the best-performing one.

Figure 3A:
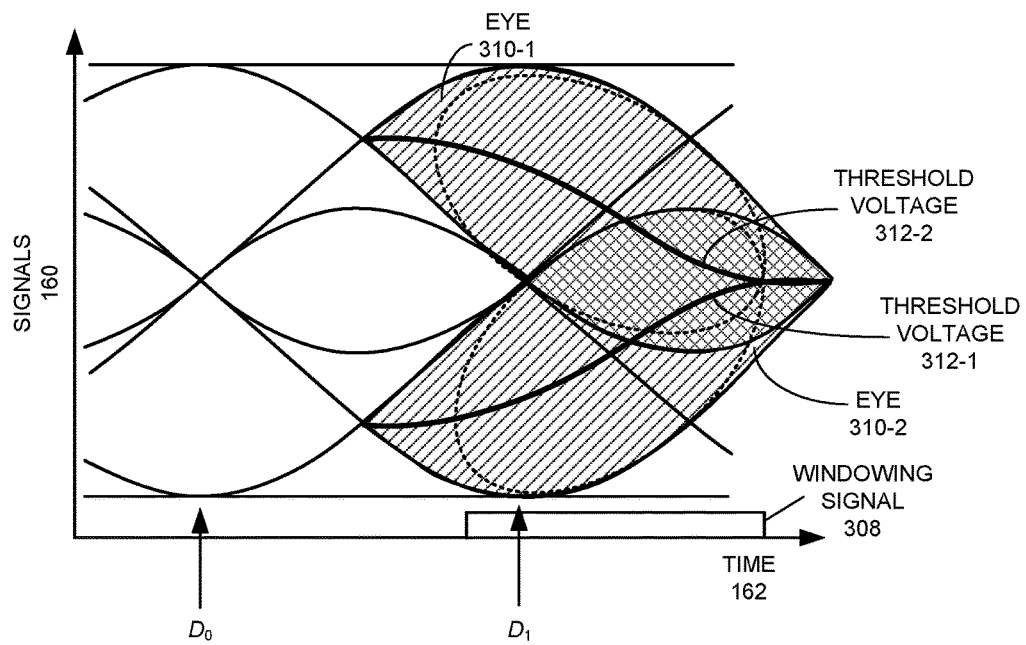
FIG. 3A illustrates an exemplary eye pattern for 2-PAM signals received by the receive circuit in the system of FIG. 1A.

In FIG. 3A, time-varying threshold voltages 312-1 and 312-2 correspond to the SBR. Time-varying threshold voltage 312-1 has a time-varying profile that is the opposite of time-varying threshold voltage 312-2. Therefore, the threshold voltage for difference circuits 210-1 in FIG. 2A may be $\alpha(t)$, and the threshold voltage for difference circuits 210-2 in FIG. 2A may be $-\alpha(t)$, relative to the median voltage between the highest and lowest signal levels. As a result, the usable portions of the two eye openings 310-1 and 310-2 (as denoted by the two rotated ovals) can be significantly increased, as compared with those illustrated in FIG. 1C. More generally, there may be different threshold voltages for different eyes, such as eye patterns 310-1 and 310-2 (and, thus, for difference circuits 210-1 and 210-2 in FIG. 2A). In some embodiments, a time-varying threshold voltage has a non-zero second time derivative. For example, the time-varying threshold voltage trace can begin at left tip of the eye opening and end at the right tip of the eye opening, with a wave form based on the function 1-SBR(t), trigonometric functions such as Sin(t), or other curves that may approximate the ideal time-varying threshold. The waveform of a time-varying threshold voltage can be stored in registers.

Figure 3B:
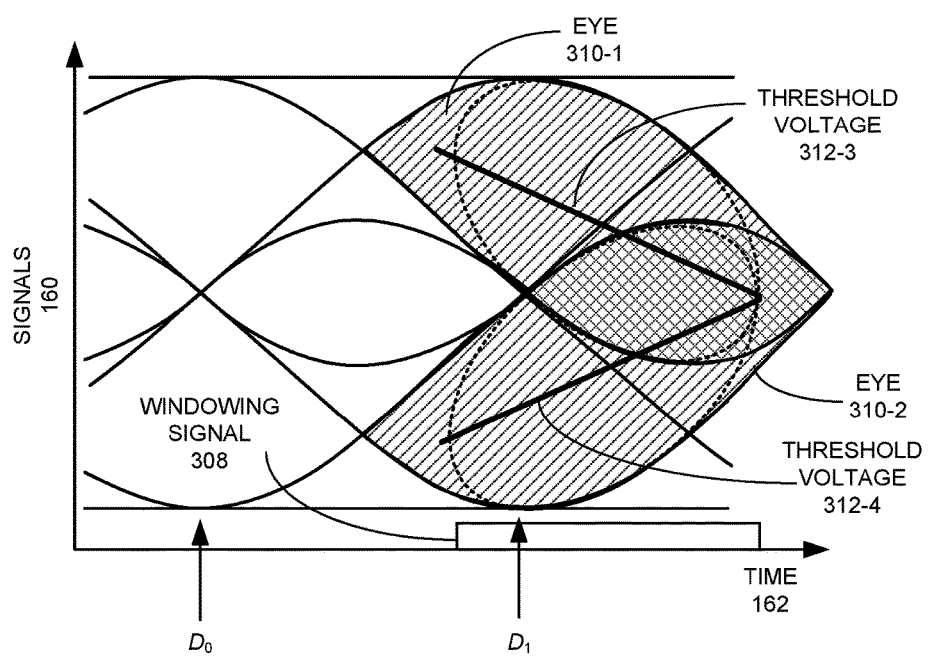
FIG. 3B illustrates an exemplary eye pattern for 2-PAM signals received by the receive circuit in the system of FIG. 1A.

FIG. 3B presents an eye pattern for 2-PAM signals during communication. In FIG. 3B, time-varying threshold voltages 312-3 and 312-4 are linear ramps as a function of time with, respectively, negative and positive slopes. The starting and ending values of the threshold voltages can coincide with the mid-points of a respective eye opening. The duration (and hence the slope) of the threshold voltage can be controlled by the windowing signal 308. Thus, the time-varying threshold voltage for difference circuit 210-1 in FIG. 2A may be $\alpha(t)$, and the time-varying threshold voltage for difference circuit 210-2 in FIG. 2A may be $-\alpha(t)$. Other forms of the time-varying threshold $\alpha(t)$ are also possible. For example, the time-varying threshold can be different from bit to bit within a certain number of bits, in terms of both starting/ending values and waveform. Furthermore, the receiver can configure the waveform and/or amplitude of the threshold voltage based on the incoming signal.

The effect of the time-varying threshold voltages is to vary the sampling thresholds in receiver, which effectively "rotates" the usable portion of an eye pattern from the slicer's perspective so that the trend of the threshold voltage is better aligned with the eye openings 310-1 and 310-2, thereby increasing the voltage and the timing margin (compare the ovals which represent the usable portion of an eye opening in FIGS. 3A and 3B with the ovals in FIG. 1C). In embodiments with integrator circuits, this results in a larger average voltage value being integrated over a larger window (such as when windowing signal 308 is 'high'), with a commensurate increase in the signal-to-noise ratio and decrease in bit-error rate. In order to fully illustrate the impact of time-varying threshold voltages 312, eyes 310 may be shifted by their corresponding time-varying thresholds and overlapped (which is referred to as "folding").

Figure 3C:
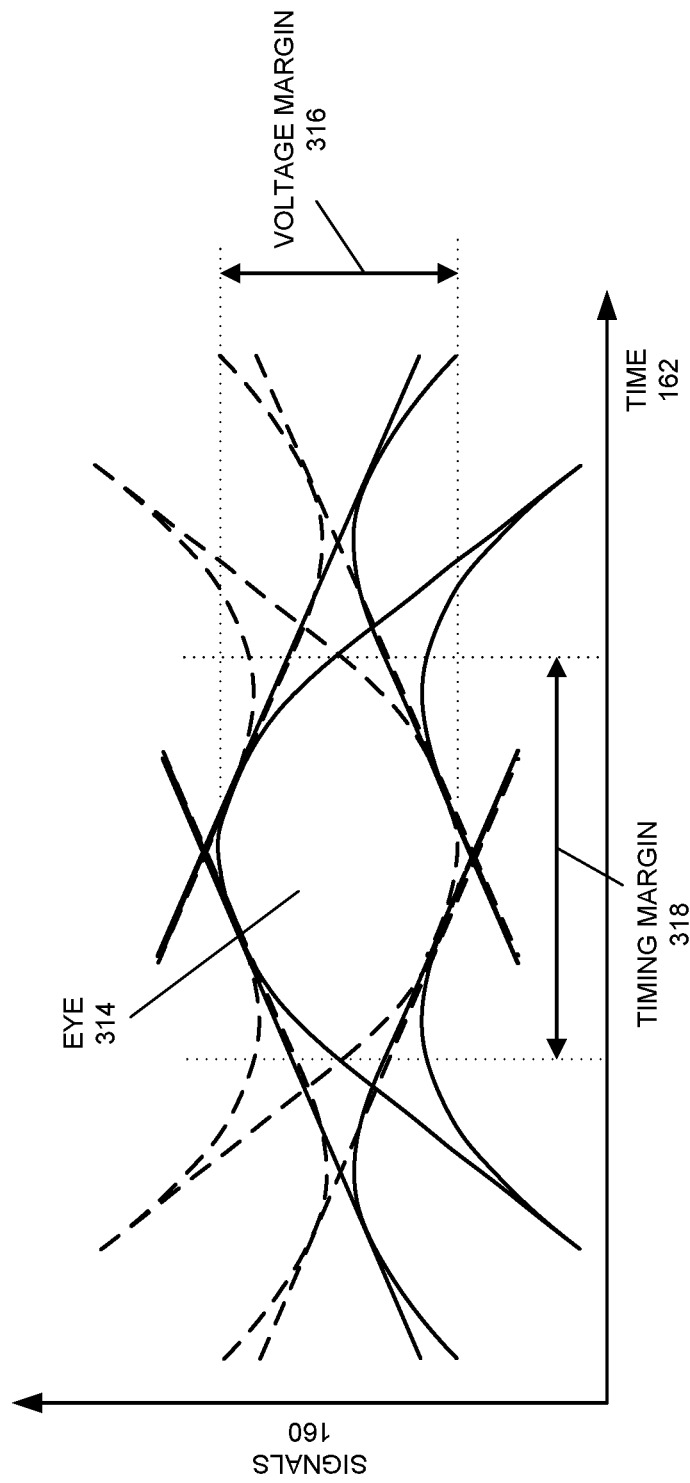
FIG. 3C illustrates a folded eye pattern corresponding to the eye pattern illustrated in FIG. 3B.

FIG. 3C presents such a folded eye pattern for the 2-PAM signals in FIG. 3B that illustrates the larger total usable area of the elliptical-shaped eye 314 on the right-hand side of the eye pattern. Because of the time-varying threshold voltages, the usable portion of the eye 314 is larger than the usable portion of either of eyes 164-1 and 164-2 (FIG. 1C), i.e., voltage margin 316 and timing margin 318 are increased.

Figure 3D:
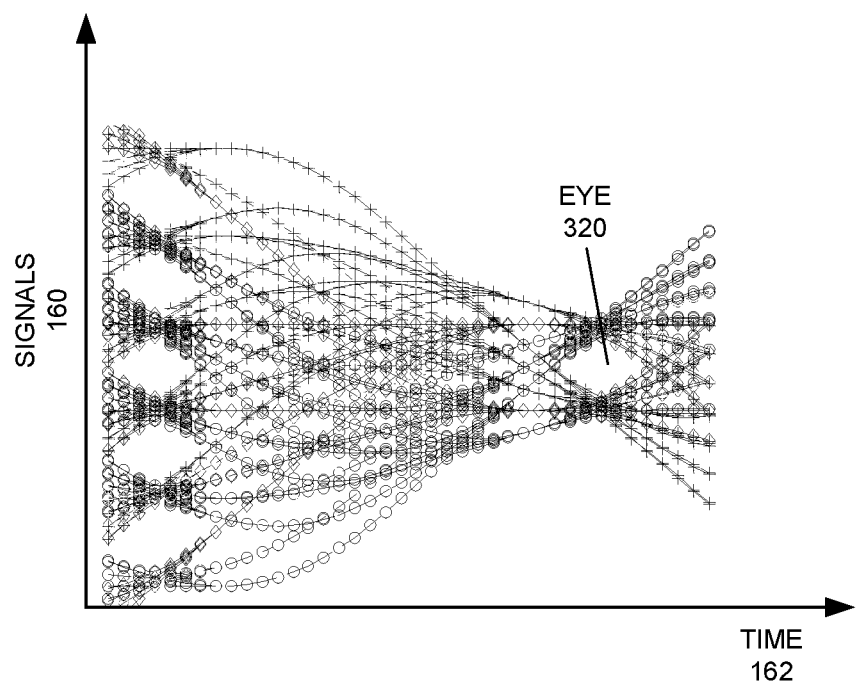
FIG. 3D illustrates a simulated folded eye pattern for 4-PAM signals sampled with a time-varying threshold voltages.
Figure 3E:
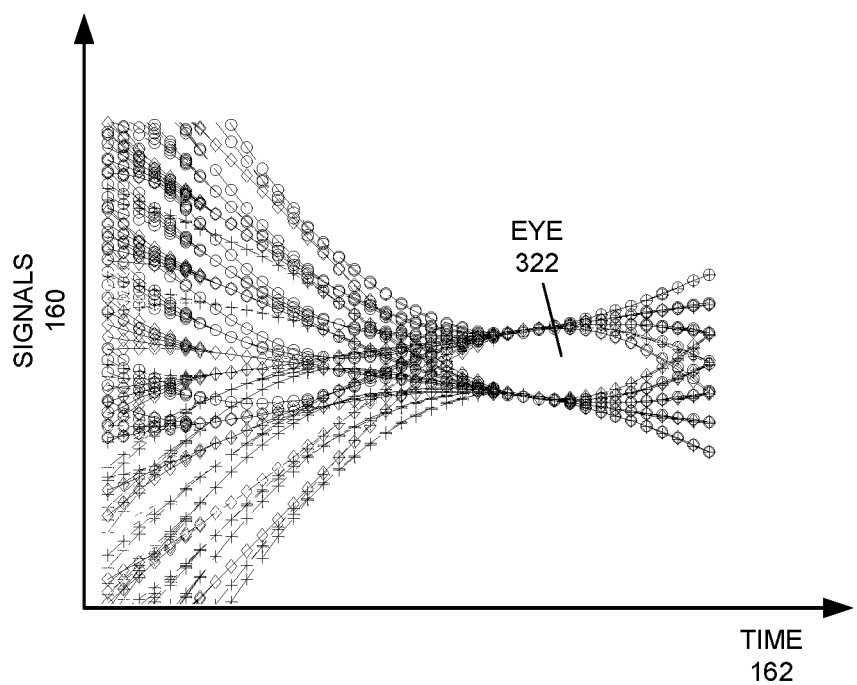
FIG. 3E illustrates a simulated folded eye pattern for 4-PAM signals sampled with a time-varying threshold voltages.

For comparison, another illustration is provided in FIG. 3D, which presents a simulated folded eye pattern for 4-PAM signals where all 3 eyes are folded on top of each other to represent an equivalent eye margin, and with prDFE having a 1+D target pattern with non-time-varying threshold voltages. FIG. 3E, which presents a simulated folded eye pattern for the 4-PAM signals sampled with time-varying threshold voltages. The voltage and timing margins of eye 322 in FIG. 3E is visibly improved over eye 320 in FIG. 3D.

While FIGS. 3D and 3E illustrate a particular equalization target (1+D), in general a wide variety of equalization targets may be used including Finite Impulse Response (FIR) and infinite-impulse-response targets. For example, for FIR targets, in general the equalization target may be $(1-rD)^n \cdot (1+sD)^m$, where m and n are integers, and r and s are real numbers.

Figure 4:
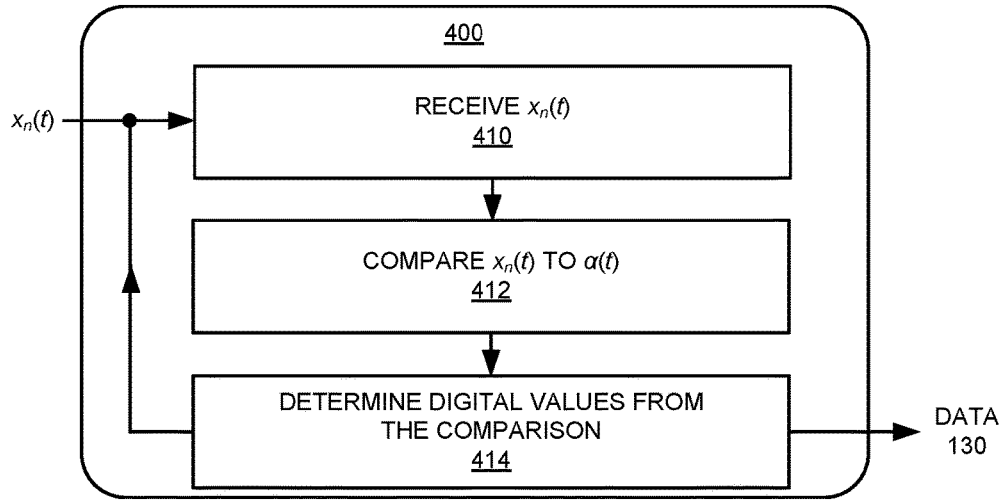
FIG. 4 illustrates a process for determining digital values from a received signal.

FIG. 4 illustrates a process 400 for determining digital values from a received signal $x_n(t)$. In process 400, in response to receiving the signal $x_n(t)$ (operation 410), a receiver compares the received signal to a time-varying threshold voltage $\alpha(t)$ (operation 412), which varies during the bit-time. Then, the receiver determines the digital values and outputs data 130 from the comparison of the received signal and the time-varying threshold voltage (operation 414).

A receive (such as circuit 122 in FIG. 1A) can include multiple receivers corresponding to different signaling links. As mentioned, these receivers may share the time-varying threshold voltage(s). For example, the signaling links may include a parallel bus having multiple signal paths, and the multiple receivers may each be coupled to a signal path and determine digital values using commonly supplied time-varying threshold voltage(s). For example, as mentioned above in connection with FIG. 1C, a common time-varying threshold voltage generator 136 can be used to generate a common time-varying threshold voltage, which is shared across receivers 126-1 to 126-N.

Figure 5A:
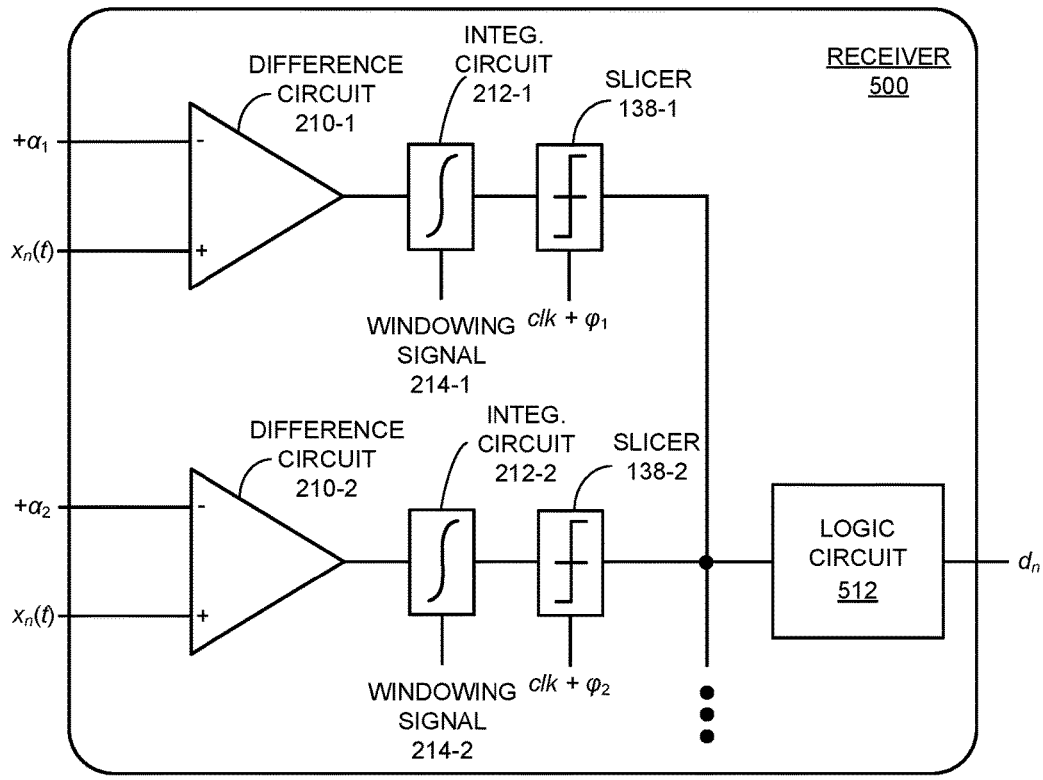
FIG. 5A illustrates an exemplary receiver.

In some embodiments, a receiver may implement a fixed-voltage equivalent to a time-varying threshold voltage. This is shown in FIG. 5A. In receiver 500, there are multiple receivers each including a difference circuit (such as difference circuits 210-1 and 210-2), an integrator circuit (such as integrator circuits 212-1 and 212-2), and a slicer (such as slicers 138-1 and 138-2). Moreover, each of difference circuits 210-1 and 210-2 has a different fixed threshold voltage $\alpha_i$. FIG. 5A provides an example of a receiver that uses multiple, fixed-threshold circuits to effectively apply varying thresholds within a single bit time, in a controlled manner, i.e., by using multiple, different thresholds at a different points within a single bit time.

In the example of FIG. 5A, integrator circuits 212-1 and 212-2 are used to integrate the output of the respective difference circuits 210-1 and 210-2. Each of slicers 138-1 and 138-2 has a different windowing-signal time shift and sampling time during the bit-time according to the corresponding phase $\varphi_i$ during a bit period. Logic circuit 512 may determine the digital values $d_n$ based at least on outputs from slicers 138-1 and 138-2.

Figure 5B:
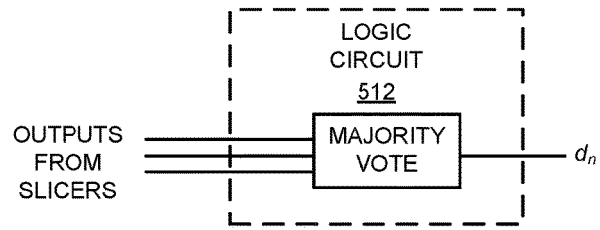
FIG. 5B illustrates the logic circuit of FIG. 5A.

FIG. 5B provides greater detail on the operation of logic circuit 512. Logic circuit 512 may include a circuit to perform a majority vote based on the output of the slicers 138-1 and 138-2. That is, the output of logic circuit 512, $d_n$, is determined by the majority value among the outputs of slicers 138-1 and 138-2. The digital values $d_n$ may be input to a multiplexer (MUX) used for partial response selection.

Figure 5C:
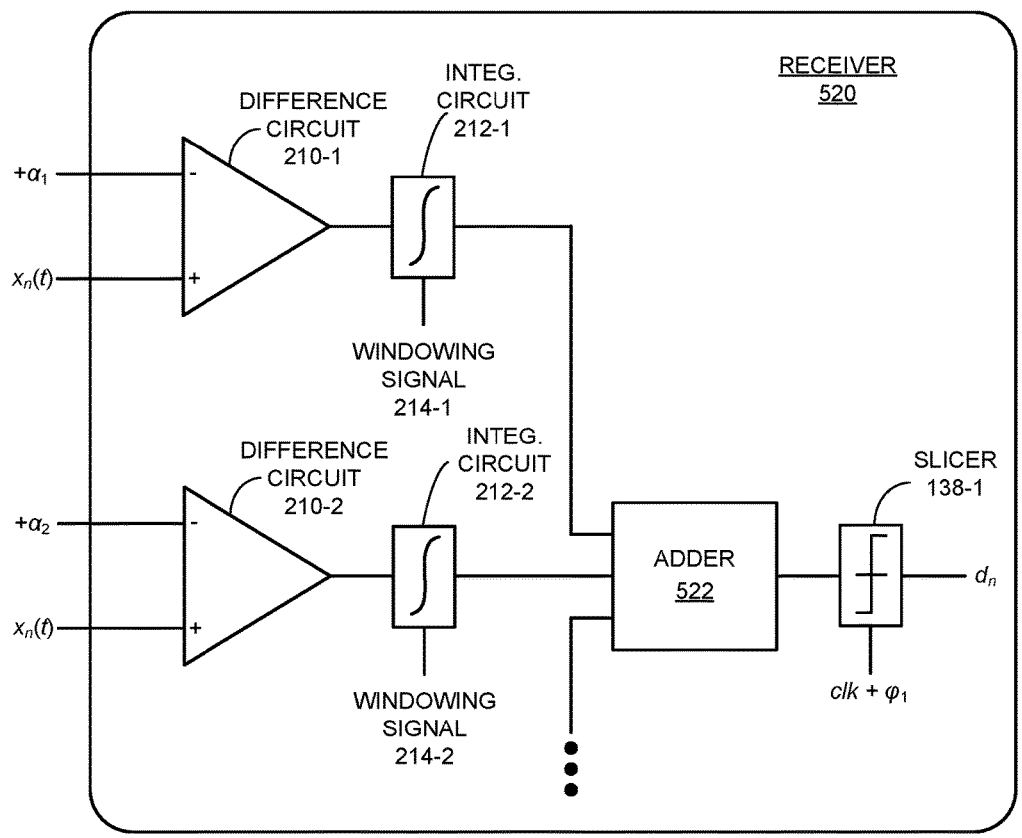
FIG. 5C illustrates an exemplary receiver.

FIG. 5C illustrates another embodiment of a receiver 520 that implements a discrete equivalent to a time-varying threshold voltage. In receiver 520, outputs from integrator circuits 212-1 and 212-1 are added using adder 522 (such as an op-amp adder circuit). Then, the resulting signal is sampled by slicer 138-1. In this example, integrator circuits 212 each may have shifted windowing intervals as specified by windowing signals 214.

Figure 6A:
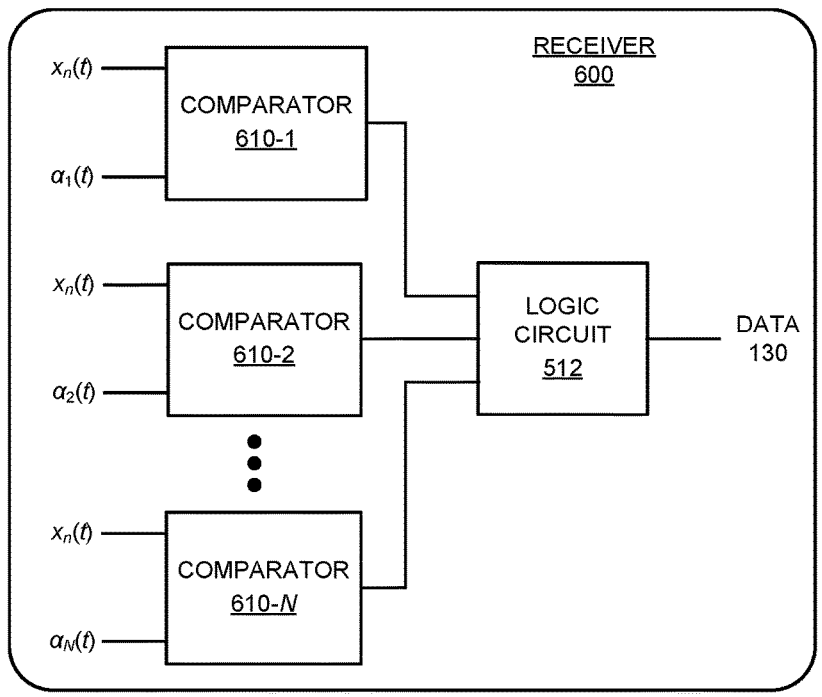
FIG. 6A illustrates an exemplary receiver for multi-PAM signals.
Figure 6B:
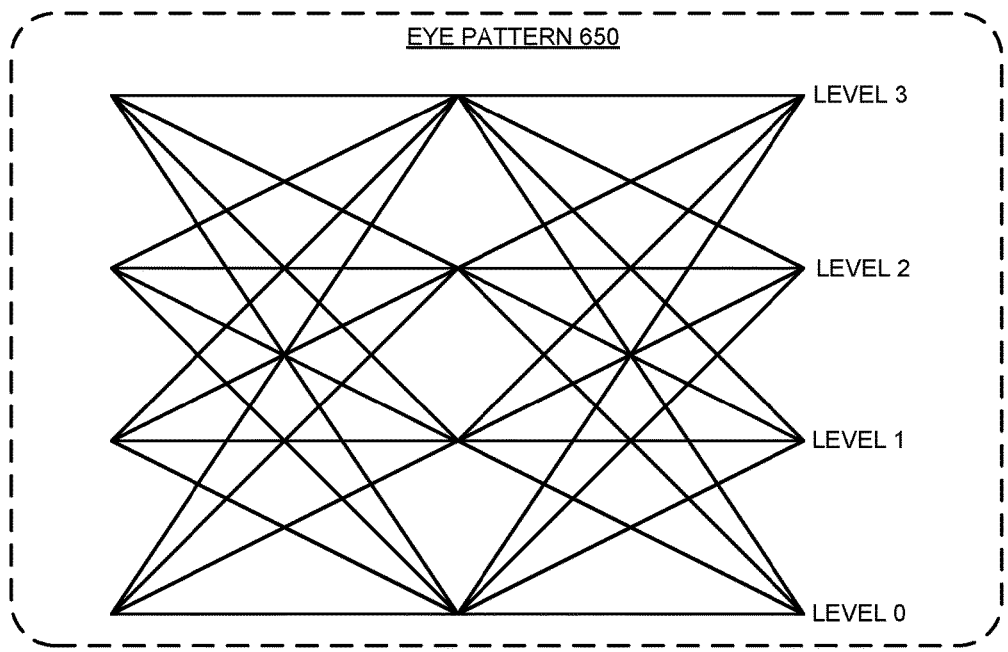
FIG. 6B illustrates a theoretic eye pattern for 4-PAM signals.

In some embodiments, there are multiple comparators in a receiver in a parallel architecture. This is shown in FIG. 6A, which presents a receiver 600 that includes comparators 610-1 to 610-N, each of which may have different time-varying threshold voltages $\alpha_i(t)$ as one of its inputs. Digital outputs from comparators 610-1 to 610-N may be combined by logic circuit 512 to provide data 130. This approach may be useful when there are different time-varying threshold voltages $\alpha_i(t)$ with different magnitudes associated with different levels in an eye pattern. For example, there may be different time-varying threshold voltages $\alpha_i(t)$ associated with different pairs of levels in a theoretical eye pattern 650 for 4-PAM signals illustrated in FIG. 6B. Thus, the magnitude of the time-varying threshold voltages $\alpha_i(t)$ for different eyes in the eye pattern may be different than one another.

Figure 7:
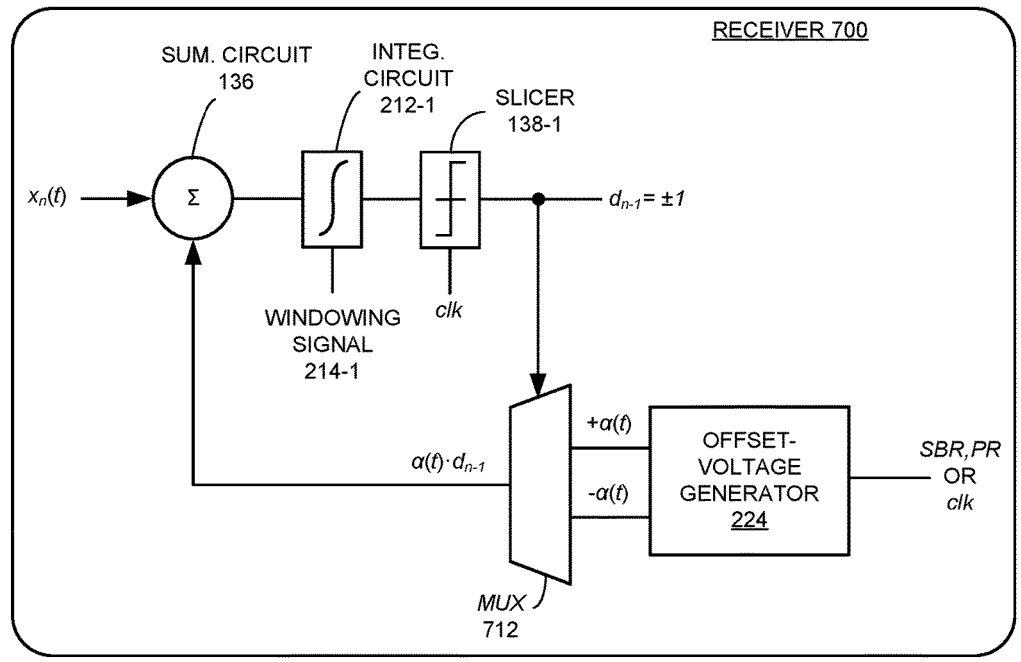
FIG. 7 illustrates a receiver.

While the preceding embodiments have illustrated the use of time-varying threshold voltages in prDFE receivers, this approach may also be used in DFE receivers or other types of receivers. This is shown in FIG. 7, which presents a receiver 700. Receiver 700 includes: analog summation circuit 136 to sum the received signal $x_n(t)$ and a current time-varying threshold voltage ±α(t); integrator circuit 212-1 to integrate the sum of the received signal $x_n(t)$ and the current time-varying threshold voltage ±α(t); a slicer 138-1 to determine the digital values $d_n$; and a multiplexer (MUX) 712 to select the current time-varying threshold voltage ±α(t). In particular, multiplexer (MUX) 712 selectively outputs the time-varying threshold voltage +α(t) or the negative time-varying threshold voltage −α(t) based on the digital value of the previous bit $d_{n-1}$. As discussed previously in conjunction with FIG. 2A, offset-voltage generator 224 may generate the time-varying threshold voltage +α(t) and the negative time-varying threshold voltage −α(t) based on a voltage-change rate associated with an isolated transition(s) in received signal $x_n(t)$ (such as the SBR or the PR). Alternatively or additionally, the starting and ending times of the time-varying threshold voltages may be determined from the clock signal (clk).

Figure 8:
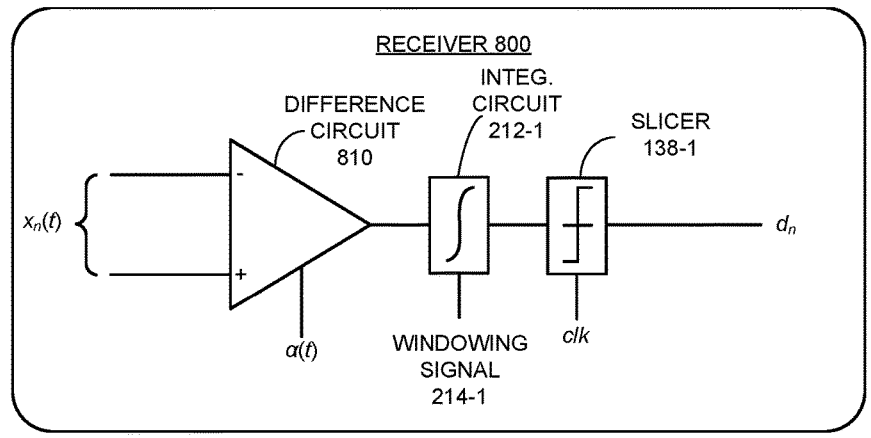
FIG. 8 illustrates a receiver.

FIG. 8 presents a receiver 800, where the time-varying threshold voltage is applied as an offset waveform to the offset port of difference circuit 810. The resulting output is integrated by integrator circuit 212-1, and sampled and quantized by slicer 138-1. As illustrated in FIG. 8, the received signal $x_n(t)$ is a differential signal. The preceding embodiments described in FIGS. 1A-7, as well as receiver 800, may be used with single-ended or differential signals.

The described embodiments may include fewer or additional components. For example, data may be converted from parallel to serial using an N:1 parallel-to-serial converter prior to transmission and from serial to parallel using a 1:N serial-to-parallel converter after being received. In some embodiments, a Viterbi decoder is used. Furthermore, components may be combined into a single component and/or the position of one or more components may be changed. Furthermore, the time-varying threshold voltages can be used to detect multi-PAM signals, such as 2-PAM, 4-PAM, 8-PAM, 16-PAM, 32-PAM, duo-binary, etc.

Furthermore, this approach may be used for intra- or inter-chip communication. In some embodiments the transmit circuit may be in a memory controller (or processor), and the receive circuit may be in a memory device (or vice versa). The signaling links between the transmit circuit and receive circuit may communicate data, the clock signal, or commands.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII) or Electronic Design Interchange Format (EDIF). Those of skill in the art of integrated circuit design can develop such data structures from schematic diagrams of the type detailed above and the corresponding descriptions and encode the data structures on a computer-readable medium. Those of skill in the art of integrated circuit fabrication can use such encoded data to fabricate integrated circuits comprising one or more of the circuits described herein.

Figure 9:
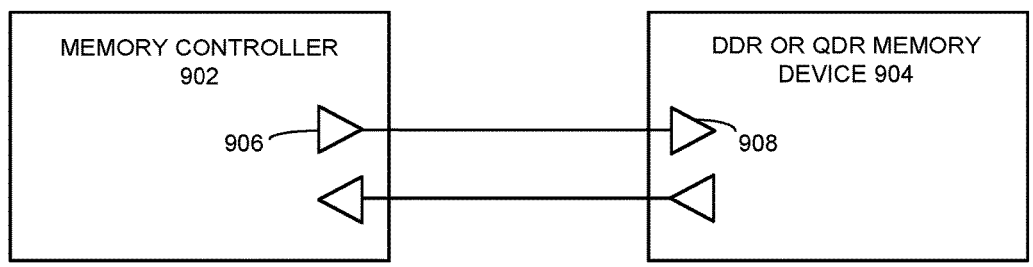
FIG. 9 illustrates an exemplary memory system which includes a PAM receiver equipped with time-varying threshold voltages.

While the present disclosure has been described in connection with specific embodiments, the claims are not limited to what is shown. For example, in some embodiments the links between a transmit circuit and a receive circuit may utilize half-duplex or full-duplex communication (i.e., for a particular operating mode, communication on a given link may be in both directions). Similarly, the links between a transmit circuit and a receive circuit may operate at a data rate that is: a multiple of the clock frequency (such as double-data rate or DDR), quad-data rate (QDR), or high multiple data rates. Additionally, data or commands may be communicated using other encoding or modulation techniques. For example, as illustrated in FIG. 9, a memory controller is in communication with a DDR or QDR memory device 904. Memory controller 902 includes an n-PAM transmitter 906, and memory device 904 includes a receiver 908 equipped with time-varying threshold voltages as described above.

Moreover, some components are shown directly connected to one another, while others are shown connected via intermediate components. In each instance the method of interconnection, or 'coupling,' establishes some desired electrical communication between two or more circuit nodes, or terminals. Such coupling may often be accomplished using a number of circuit configurations, as will be understood by those of skill in the art. For example, the foregoing embodiments support AC-coupled links, DC-coupled links, or both. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A method of operation in an integrated circuit (IC) chip, comprising:
   receiving from a serial link a serial stream of data bits, the data bits having logical values, wherein a given logical value is within a corresponding bit-duration;
   generating a time-varying threshold voltage during the bit-duration;
   resolving the logical values from the serial stream of data bits based at least on the time-varying threshold voltage;
   storing an activation bit; and
   selectively enabling or disabling the time-varying threshold voltage based at least on the stored activation bit.

2. The method of claim 1, wherein the generating comprises:
   varying the time-varying threshold voltage linearly with time during the bit-duration.

3. The method of claim 1, wherein the generating comprises:
   varying the time-varying threshold voltage non-linearly as a function of time.

4. The method of claim 1, wherein the generating comprises:
   generating the time-varying threshold voltage with a waveform that matches a portion of a pulse response of the serial link.

5. The method of claim 1, further comprising:
   receiving a clock signal via a clock input node;
   wherein the generating comprises generating the time-varying threshold voltage based on the clock signal.

6. The method of claim 5, wherein receiving the clock signal comprises:
   receiving a source-synchronous clock signal via a communication channel.

7. The method of claim 1, further comprising a first instance of:
   integrating a difference between the received serial stream of data bits and the time-varying threshold voltage;
   determining the logical values via a slicer circuit.

8. The method of claim 1, further comprising a first instance of:
   comparing the received serial stream of data bits and the time-varying threshold voltage; and
   integrating a comparison result of the compared serial stream of data bits and the time-varying threshold voltage.

9. The method of claim 8, wherein the integrating comprises:
   gating the integrating by a windowing signal during the bit-duration.

10. The method of claim 1, wherein the received serial stream of data bits are differential signals.

11. The method of claim 1, wherein the received serial stream of data bits corresponds to multiple pulse-amplitude-modulation (multi-PAM) encoding of a data sequence.

12. The method of claim 1, further comprising:
   multiple slicers corresponding to different levels in the multi-PAM encoding, and
   wherein time-varying threshold voltages for at least two of the slicers are different.

13. A method, comprising:
   receiving a signal representing a series of logical values, wherein a given logical value is within a corresponding bit-duration;
   generating a time-varying threshold voltage during the bit-duration; and
   determining the logical values from the received signal based at least on the time-varying threshold voltage, wherein the determining includes two instances of:
      comparing the received signal and a given time-varying threshold voltage in a pair of time-varying threshold voltages;
      integrating a comparison result of the received signal and the given time-varying threshold voltage;
   wherein the determining further comprises:
      feeding back a stored digital value from an immediately preceding bit-duration; and
      selecting an output from one of multiple slicers during a current bit-duration based at least on the stored digital value.

14. The method of claim 13, wherein the determining is carried out in a double-data rate mode.

15. A method, comprising:
   receiving via a serial link a 4-Pulse Amplitude Modulation (4-PAM) signal representing a series of logical values, wherein a given logical value is within a corresponding bit-duration;
   generating four time-varying threshold voltages during the bit-duration; and
   determining the logical values from the received 4-PAM signal based at least on the four time-varying threshold voltages, wherein the determining includes four instances of:
      comparing the received signal and a given one of the four time-varying threshold voltages; and
      integrating a comparison result of the received signal and the given time-varying threshold voltage.

16. The method of claim 15, wherein the determining further comprises:
   feeding back a stored digital value from an immediately preceding bit-duration; and
   selecting an output from one of multiple slicers during a current bit-duration based at least on the stored digital value.

17. The method of claim 15, wherein the generating comprises:
   varying each of the four time-varying threshold voltages linearly with time during the bit-duration.

18. The method of claim 15, wherein the generating comprises:
   varying each of the four time-varying threshold voltages non-linearly as a function of time.

19. The method of claim 15, wherein the generating comprises:
   generating each of the four time-varying threshold voltages with a waveform that matches a portion of a pulse response of the serial link.

20. The method of claim 15, further comprising:
   receiving a clock signal via a clock input node;
   wherein the generating comprises generating each of the four time-varying threshold voltages based on the clock signal.

* * * * *